United States Patent
Yanagisawa

(10) Patent No.: US 6,876,012 B2
(45) Date of Patent: Apr. 5, 2005

(54) HETERO-BIPOLAR TRANSISTOR

(75) Inventor: Masaki Yanagisawa, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 10/370,604

(22) Filed: Feb. 24, 2003

(65) Prior Publication Data

US 2003/0160266 A1 Aug. 28, 2003

(30) Foreign Application Priority Data

Feb. 25, 2002 (JP) ........................................ 2002-048498

(51) Int. Cl.[7] ........................................ H01L 31/0328
(52) U.S. Cl. ..................... 257/197; 257/191; 257/192; 257/194; 257/195; 257/198; 257/201; 257/184; 257/187
(58) Field of Search ................................ 257/197, 192, 257/194, 195, 198

(56) References Cited

U.S. PATENT DOCUMENTS

| | | | | |
|---|---|---|---|---|
| 4,924,283 A | * | 5/1990 | Ohshima ..................... | 257/191 |
| 4,979,009 A | * | 12/1990 | Kusano et al. .............. | 257/197 |
| 5,159,424 A | * | 10/1992 | Morishita .................... | 257/197 |
| 5,177,583 A | * | 1/1993 | Endo et al. .................. | 257/190 |
| 5,557,117 A | * | 9/1996 | Matsuoka et al. .......... | 257/184 |
| 5,561,306 A | * | 10/1996 | Imamura et al. ............ | 257/197 |
| 5,691,546 A | * | 11/1997 | Morishita .................... | 257/19 |
| 5,952,672 A | * | 9/1999 | Kikkawa ..................... | 257/15 |
| 6,207,976 B1 | * | 3/2001 | Takahashi et al. .......... | 257/192 |
| 6,384,431 B1 | * | 5/2002 | Takahashi et al. .......... | 257/147 |

FOREIGN PATENT DOCUMENTS

| JP | 2000299386 | * 10/2000 | ....... H01L/21/8222 |
|---|---|---|---|
| JP | 2003-007715 | 1/2003 | |

OTHER PUBLICATIONS

Japanese Office Action dated Feb. 19, 2004 with English-language translation.
Jingming Xu et al., *A Tunneling Emitter Bipolar Transistor*, EEE Electron Device Letters, vol. EDL–7, No. 7, Jul. 1986, pp. 416–418.
F.E. Najjar et al., *DC Characterization of the AlGaAs/GaAs Tunneling Emitter Bipolar Transistor*, Applied Physics Letters, vol. 50 (26), Jun. 29, 1987, pp. 1915–1917.
A.F.J. Levi et al., *AlAs/GaAs Tunnel Emitter Bipolar Transistor*, Applied Physics Letters, vol. 54 (22), May 29, 1989, pp. 2250–2252.
Copending U.S. Appl. No. 10/436,422, filed May 13, 2003.

* cited by examiner

Primary Examiner—Nathan J. Flynn
Assistant Examiner—Fazli Erdem
(74) Attorney, Agent, or Firm—Smith, Gambrell & Russell, LLP

(57) ABSTRACT

The present invention provides a Hetero-Bipolar Transistor that suppresses a recombination current between electrons in the conduction band of an emitter and holes in the valence band of a base, which results on an enhancement of the current gain of the transistor. The HBT according to the present invention comprises a semi-insulating semiconductor substrate and a series of semiconductor layers on the substrate. The semiconductor layers are a buffer layer, a sub-collector layer a collector layer, a base layer, an emitter layer, an emitter contact layer, and an intermediate layer between the emitter layer and the emitter contact layer. The emitter layer has a carrier concentration of $1.0 \times 10^{19}$ cm$^{-3}$.

14 Claims, 7 Drawing Sheets

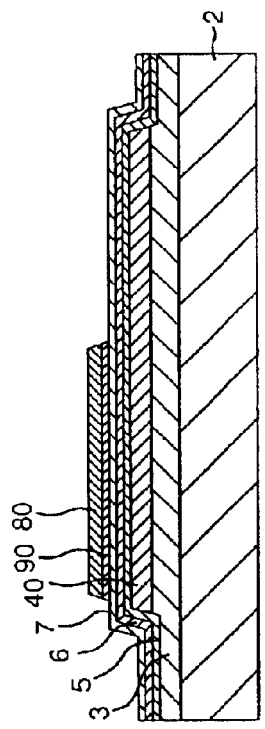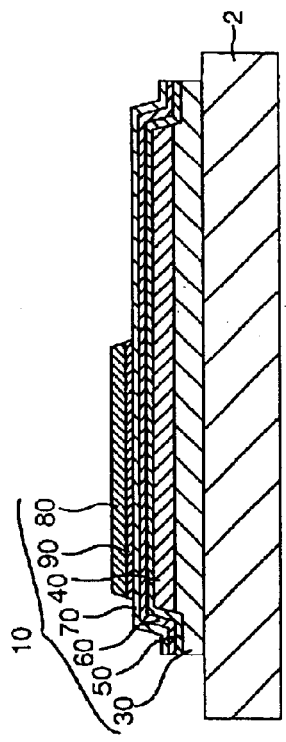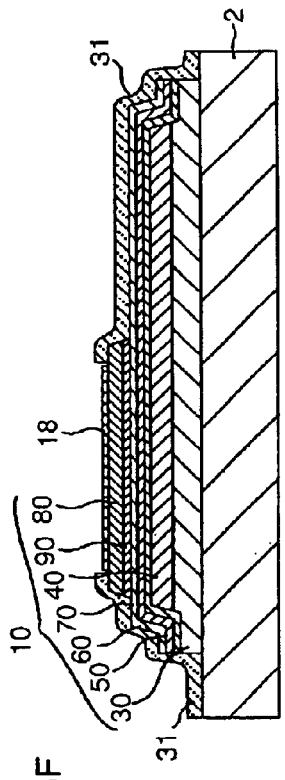
Fig. 5D
Fig. 5E
Fig. 5F
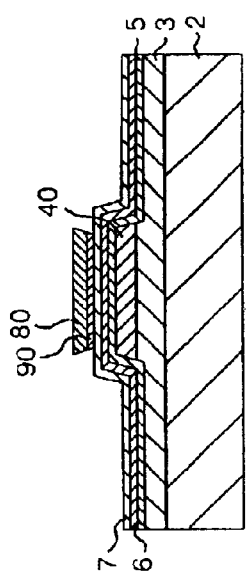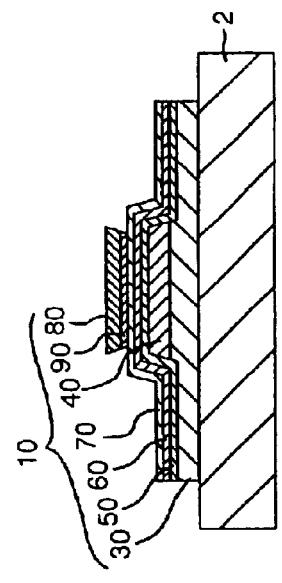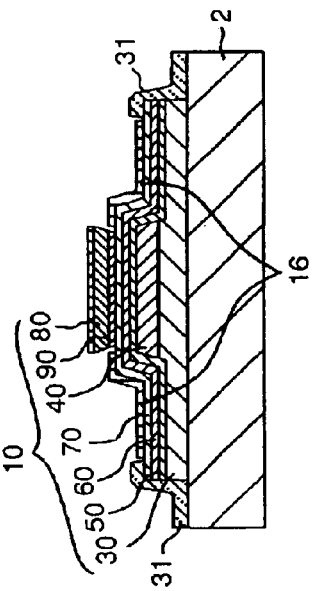
Fig. 5A
Fig. 5B
Fig. 5C

HETERO-BIPOLAR TRANSISTOR

BACKGROUND OF THE INVENTION

1. Field of the Invention

This invention relates to a hetero-bipolar transistor (HBT), particularly to an HBT made of group III-V compound semiconductor materials.

2. Related Prior Art

A tunneling emitter bipolar transistor (TEBT) is a device that achieves a superior high frequency performance and a current gain. Such characteristics of the TEBT are reported in the IEEE Electron Device Letters, vol. EDL-7 pp. 416, (1986) and Applied Physics Letters, vol. 50(26) pp. 1915 (1987). The former document discloses the structure of the TEBT in which a base and an emitter are made of GaAs and a tunnel emitter of AlGaAs is inserted therebetween with a thickness of 3 nm to 20 nm. In this configuration, electrons can tunnel through the AlGaAs emitter layer, while the hole injection from the base layer to the emitter layer is suppressed because the tunnel probability for the hole is smaller as compared with electrons therethrough. Moreover, even in increasing the hole concentration in the base layer to decrease the base resistance, the hole injection to the emitter layer can be kept low. The TEBT achieves both an enhanced current gain and high frequency performance.

However, the AlGaAs tunnel emitter layer with a greater energy band gap as compared with the base layer must be sufficiently so as to allow electrons to tunnel therethrough. In addition, in order to attain such superior characteristics, the base layer must be heavily doped to reduce the base resistance. Such layer structure increases the carrier recombination between electrons in the emitter contact layer and holes in the base layer. This causes an increase of the base current, and accordingly decreases the current gain of the transistor.

SUMMARY OF THE INVENTION

The object of the present invention is to suppress such carrier recombination and to provide the bipolar transistor with a high current gain.

A bipolar transistor according to one aspect of the present invention comprises a semiconductor substrate and a series of semiconductor layers that are grown sequentially on the substrate. The grown layers are a collector layer, a base layer, an emitter layer, an emitter contact layer and an intermediate layer between the emitter layer and the emitter contact layer. The emitter layer has a greater band gap energy than the base layer, and has a thickness that allows the electron to tunnel therethrough. The intermediate layer has a carrier concentration smaller than that of the emitter contact layer.

In the structure described above, the carrier depleted region formed by the junction between the base layer and the emitter layer extends to the emitter contact layer, can suppress the carrier recombination between electrons in the conduction band of the emitter contact layer and holes in the valence band of the base layer, which results in the enhancement of the current gain of the transistor. Further, since the emitter layer has a greater band gap energy than that of the base layer and the thickness of the emitter layer is such that the electron can tunnel therethrough, the majority carrier, which are electrons in the emitter contact layer in NPN transistor, can be easily injected from the emitter contact layer to the base layer.

The intermediate layer preferably has a smaller band gap energy than that of the emitter layer. The carrier distribution in the intermediate layer preferably increases monotonically from the interface of the emitter contact layer to the interface of the emitter layer. Therefore, the carrier depleted region can extend from the emitter layer into the intermediate layer. This reduces the carrier recombination between holes in the valence band and electrons in the conduction band, and enhances the current gain.

The carrier concentration of the intermediate layer is preferably not greater than $1 \times 10^{18}$ cm$^{-3}$ so that the carrier depleted region extends satisfactorily from the emitter layer to the intermediate layer.

The emitter layer preferably has a thickness in the range of 2 nm to 30 nm so that electrons in the conduction band can tunnel and holes in the valence band can be prevented from tunneling therethrough.

According to another aspect of the present invention, the bipolar transistor preferably has a sub-collector layer, the carrier concentration of which is greater than that of the collector layer and the entire surface of which is covered by the collector layer. This configuration defines the intrinsic collector region by the sub-collector layer, which decreases the capacitance parasitically formed between the base layer and the sub-collector layer and the high frequency performance of the transistor is enhanced.

The transistor of the present invention is preferably composed of InP for the emitter layer and InGaAs for the base layer. Another combination of InAlAs for the emitter layer and InGaAs for the base layer is also preferable.

BRIEF DESCRIPTION OF THE DRAWINGS

FIGS. 5A to 5C are cross-sectional views along the [01-1] direction, and FIGS. 5D to 5F are cross sectional views along the [011] direction at the respective manufacturing steps;

DETAILED DESCRIPTION OF THE INVENTION

Figure 1A:
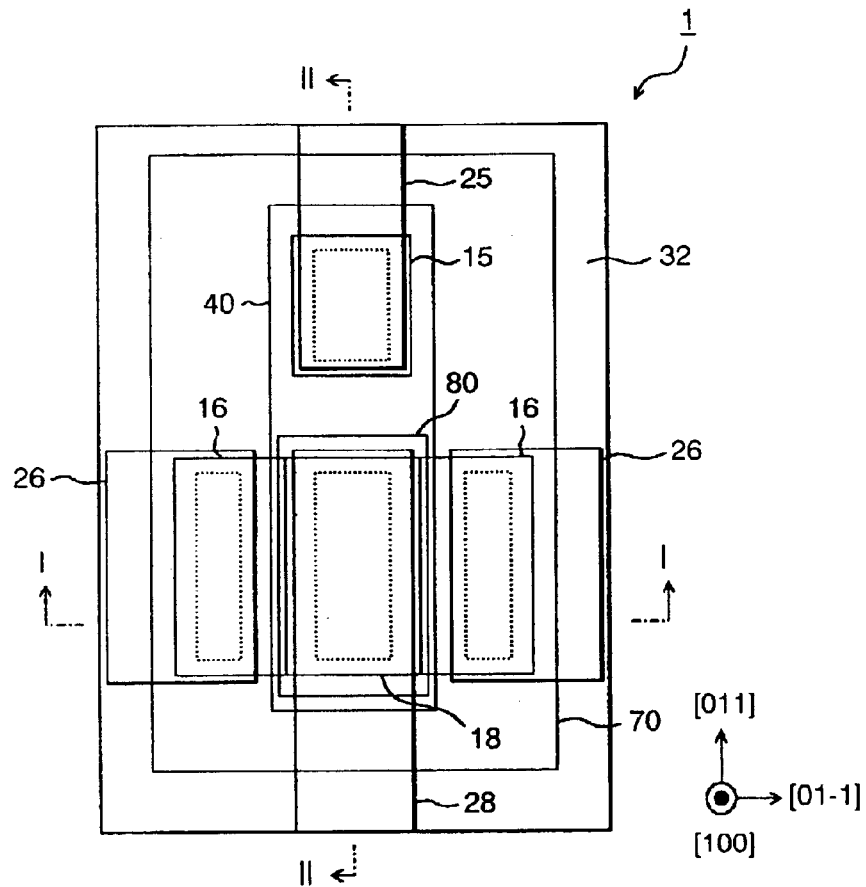
FIG. 1A is a plan view of a HBT according to the present invention.

The preferred embodiments of the present invention will be described. Elements identical to each other will be referred to with numerals identical to each other without overlapping explanations. In the drawings, dimensions such as layer thickness will not always reflect their explanation. Indices of crystal surface and crystal axis appearing in the drawings are exemplary and would contain their equivalent.

First Embodiment

Figure 1B:
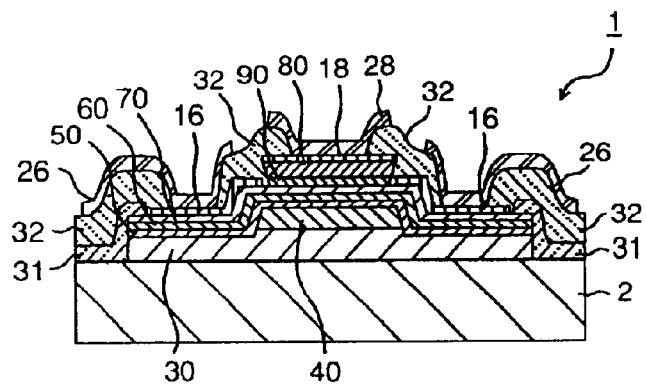
FIG. 1B is a cross-sectional view taken along line I—I in FIG. 1A.
Figure 1C:
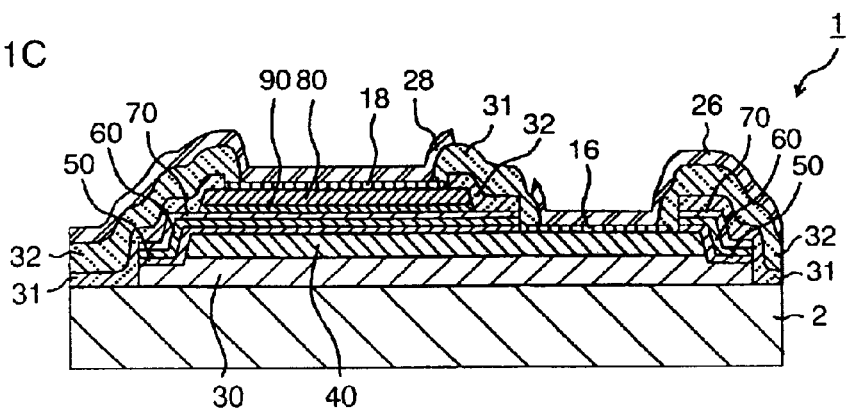
FIG. 1C is a cross-sectional view taken along line II—II in FIG. 1A.

FIG. 1A shows a plan view of an HBT according to a first embodiment of the present invention. FIG. 1B and FIG. 1C are cross-sectional views taken along line I—I and line II—II in FIG. 1A, respectively. In FIG. 1A, line I—I is along [01-1] and line II—II is along [011] in crystal direction.

The HBT 1 comprises a series of layers: A buffer layer 30 on the (100) surface of a semi-insulating InP substrate, a sub-collector layer 40 on the buffer layer, a collector layer 50 on the buffer layer and the sub-collector layer, a base layer 60 on the collector layer, an emitter layer 70 on the base layer, and an emitter contact layer 80 on the emitter layer. The emitter layer 70 and the emitter contact layer sandwich an intermediate layer 90 therebetween.

The buffer layer 30 is an undoped $In_xGa_{1-x}As$ (hereinafter InGaAs) with a thickness from 300 nm to 500 nm. The sub-collector layer 40 is an n-type InGaAs with a thickness from 300 nm to 500 nm doped with Si by the range of $0.5 \times 10^{19}$ $cm^{-3}$ to $2.0 \times 10^{19}$ $cm^{-3}$. The plane shape of the sub-collector layer 40 is nearly rectangle, the longer side of which extends along the [011] direction. All side surfaces of the sub-collector layer 40 show a normal trapezoid, as shown in FIG. 1B and FIG. 1C.

The collector layer 50 is an n-type InGaAs with a thickness from 300 nm to 500 nm. The collector layer 50 has a rectangle plane shape, one side of which extends along [011] while the other sides normal to the former side extend along [01-1]. The collector layer 50 is lightly doped with Si such that the carrier concentration of the layer is within the range of $1 \times 10^{16}$ $cm^{-3}$ to $5 \times 10^{16}$ $cm^{-3}$.

The base layer 60 is a p-type InGaAs with a thickness about 50 nm and heavily doped with Zinc (Zn) or Carbon (C) so as to exhibit a hole concentration within the range of $1 \times 10^{16}$ $cm^{-3}$ to $3 \times 10^{19}$ $cm^{-3}$.

The emitter layer 70 is an n-type InP with a thickness of about 10 nm to enable the tunneling of electrons. The emitter layer is doped with Si and the electron concentration is about $4 \times 10^{18}$ $cm^{-3}$. The plane shape of the emitter layer 70 is the same as the base layer 60 and the collector layer 50. Since the thickness of the layer 70 is so thin, electrons can be injected from the emitter-contact layer to the base layer. When the thickness of the layer is thinner than 2 nm, holes in the base layer 60 can also be injected to the emitter contact layer, which increases the base current and degrades the current gain. On the other hand, if the thickness of the emitter layer 70 is greater than 30 nm, it is difficult for electrons to tunnel from the emitter contact layer 80 to the base layer 60. Moreover, when base electrodes are formed on the emitter layer 70, the base current can not tunnel the emitter layer 70, which increases the base resistance.

The intermediate layer 90 and the emitter contact layer 80 are formed on the emitter layer so as to overlap the sub-collector layer 40. The cross sectional shape along the [01-1] direction of the intermediate layer and the emitter contact layer shows a reverse trapezoid, while their cross sectional shape along the [011] direction shows a normal trapezoid. Both layers 80 and 90 are n-type InGaAs doped with Si. The thickness of both layers are 190 nm and 20 nm, while the carrier concentrations are $2 \times 10^{19}$ $cm^{-3}$ and $4 \times 10^{17}$ $cm^{-3}$, respectively.

In this embodiment, the intermediate layer 90 and the emitter contact layer 80 have a uniform electron concentration within the respective layers. Since the concentration of the intermediate layer is about two figures smaller than that of the emitter contact layer 80, a depletion region formed by the interface between the base layer 60 and the emitter layer 70 fully depletes the intermediate layer 90. This depletion region isolates holes in the valence band of the base layer and electrons in the conduction band of the emitter contact layer.

A series of layers except the InP emitter layer 70 are made of $In_xGa_{1-x}As$ (x=0.53) lattice matched to InP within ±0.1%.

A collector electrode 15, on which wiring 25 is provided, is formed on the sub-collector layer 40. The HBT also have a base electrode 16 on the emitter layer 70 and an emitter electrode on the emitter contact layer 80. Since the electron concentration of the emitter contact layer is about $2 \times 10^{19}$ $cm^{-3}$, the emitter electrode shows a superior ohmic characteristic. Another wiring 26 and 28 are formed on the base electrode 16 and the emitter electrode 18, respectively.

Stacked metals of titanium (Ti), platinum (Pt) and gold (Au) are used for these electrodes 15, 16 and 18. Wiring 25, 26 and 28 connected to these electrodes are preferably Aluminum (Al) or the above stacked metals of Ti/Pt/Au.

The HBT 1 has insulating films 31, 32 to isolate the respective electrodes 15, 16 and 18, and to protect semiconductor layers. The insulating film is preferably a silicon nitride ($Si_3N_4$, hereinafter SiN), formed by a plasma enhanced chemical vapor deposition technique.

Next, an operation of the HBT 1 will be described. In the emitter grounded mode, a base current injected from the base electrode 16 to the base layer by tunneling through the emitter layer 70 flows within the base layer to an intrinsic region of the emitter layer. The intrinsic region of the emitter layer is a region just beneath the emitter contact layer 80. After flowing to the intrinsic emitter layer, the current again tunnels the emitter layer to the emitter contact layer 80, and finally reaches the emitter electrode 18.

On the other hand, the collector current injected from the collector electrode 15 reaches the emitter electrode by flowing through the sub-collector layer 40, the collector layer 50, the base layer 60, the emitter layer 70 and the emitter contact layer 80.

In the present HBT 1, since the carrier concentration of the sub-collector layer 40 is three figures greater than that of the collector layer 50, the current flows into the collector layer 50 from the entire surface of the sub-collector layer 40. This means that the region where the current flows in the collector layer 50 defines an intrinsic collector region. The intrinsic region has a function of the current amplification.

The current flows from the collector layer 50 into the emitter layer 70 through the base layer 60. The region where the collector current flows in the emitter layer 70 functions as an intrinsic emitter. The regions where the base electrodes 16 are formed do not contribute to the current amplification. They only function as the current path from the base electrodes 16 to the base layer.

Figure 2:
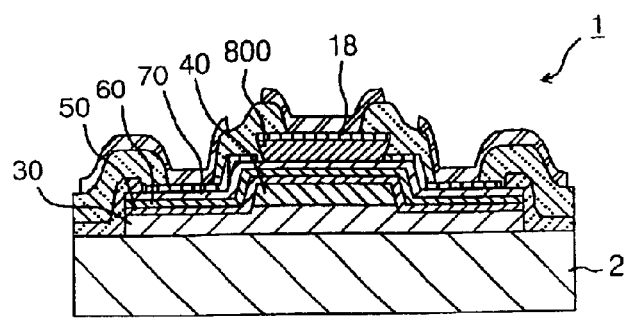
FIG. 2 is a cross sectional view showing a conventional HBT.
Figure 3A:
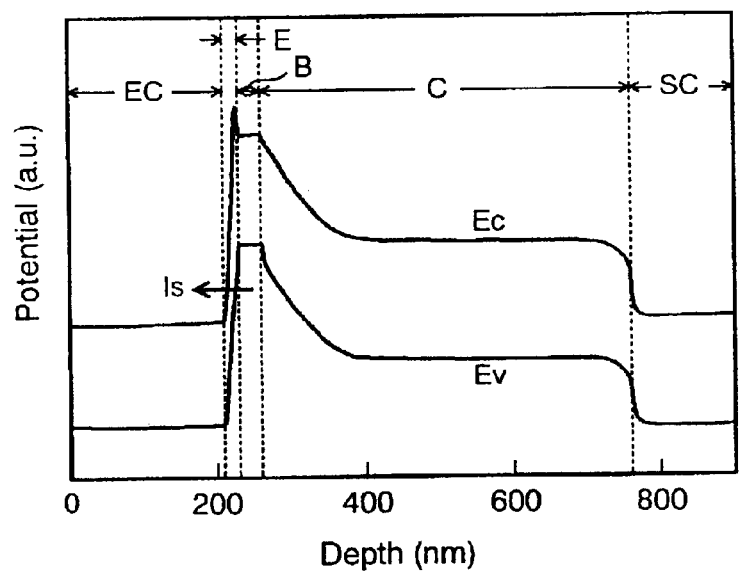
FIG. 3A is a band diagram of the conventional HBT at no bias condition.
Figure 3B:
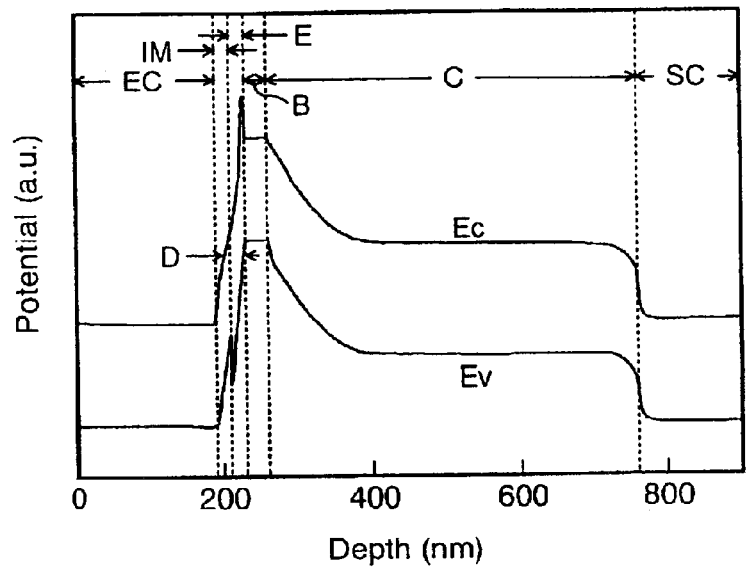
FIG. 3B is a band diagram of the present HBT.

The advantages of the present HBT 1 will be explained in the following while referring to FIGS. 2 and 3. FIG. 2 is a cross sectional view of a conventional HBT 50 and FIG. 3 compares the band diagram of the conventional HBT 50 (FIG. 3A) and the present HBT 1 (FIG. 3B). These band diagrams are calculated from the band gap energy, the carrier concentration and the thickness of the respective layers. In FIG. 3A and FIG. 3B, Ev is the top energy of the valence band, while Ec is the bottom energy of the conduction band. The horizontal axis indicates a depth measured from the surface of the emitter contact layer 80.

The conventional HBT 50 does not have an intermediate layer between the emitter layer 70 and the emitter contact layer 800. The thickness of the emitter contact layer 800 is about 210 nm, which is the sum of the intermediate layer 90 and the emitter contact layer 80 in the present HBT. The carrier concentration of the emitter contact layer 800 is about $2 \times 10^{19}$ $cm^{-3}$ and shows a uniform distribution. The remaining structures are identical to each other except the existence of the intermediate layer and the thickness of the emitter contact layer 800.

In FIG. 3, layers denoted by EC, E, B, C and SC correspond to the emitter contact layer 800, the emitter layer 70, the base layer 60, the collector layer 50 and the sub-collector layer 50. In FIG. 3A, the top of the valence band of the base layer is higher than the bottom of the conduction band of the emitter contact layer 80. Further, the thickness of the emitter layer is only 10 nm, so the recombination current flows from the base layer 70 to the emitter contact layer 80 as shown by the arrow in FIG. 3. This means there is an increase of the base current and a decrease of the current gain β.

In FIG. 3B, layers denoted by EC, E, B, C and SC also correspond to layers as explained in FIG. 3A and the top of the valence band Ev of the base layer 60 is higher than the bottom of the emitter contact layer 80. However, the distance D between the conduction band of the emitter contact layer 80 and the valence band of the base layer 60 is greater than that of the conventional HBT 50 in FIG. 3A. This is due to the existence of the intermediate layer 90 between the emitter contact layer 80 and the emitter layer 70. The layer 90 is nearly depleted because the thickness and the carrier concentration are 20 nm and $4 \times 10^{17}$ cm$^{-3}$, respectively. Therefore, the distance between the conduction band and the valence band expands to 30 nm, which decrease the recombination current and increase the current gain.

Another superior feature of the HBT 1 is that the top surface of the base layer 60 is fully covered by the emitter layer 70. This means that the emitter layer protects the base layer because the band gap energy of the emitter layer is greater than the base layer. When the surface of the base layer 60 is exposed, various types of surface states are formed at the surface and the leak current through these surface state increases. In the present HBT 1, the creation of surface states can be prevented since the base layer 60 is completely covered by the emitter layer, and these two layers are sequentially formed by the OMVPE technique.

Further in the present HBT 1, because the sub-collector layer 40 is fully covered by the collector layer 50, the area that contributes to the stray capacitance between the base and the collector can be decreased, thus the high frequency performance of the HBT 1 can be enhanced.

(Manufacturing Process for the Present HBT)

Next, a manufacturing process of the present HBT 1 will be explained.

Figure 4A:
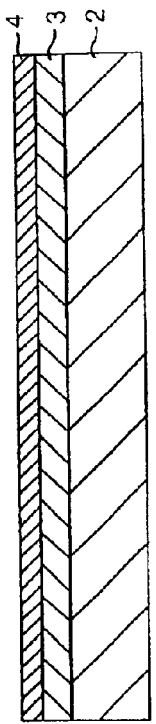
FIGS. 4A to 4C are cross-sectional views along the [01-1] direction.
Figure 4B:
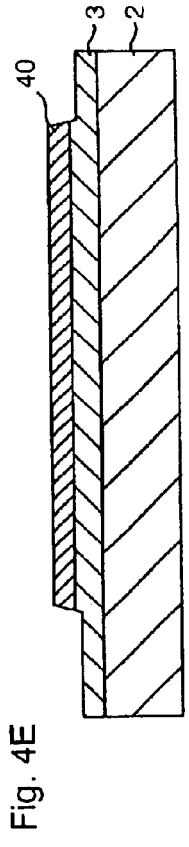
Figure 4C:
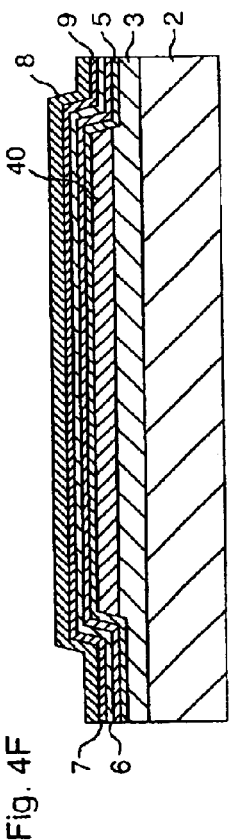
Figure 4D:
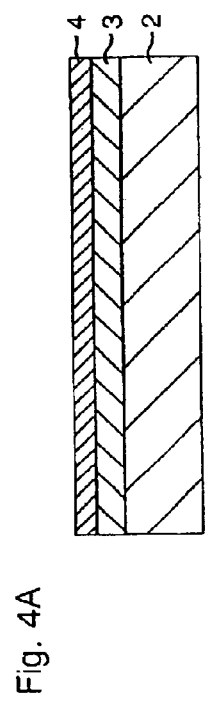
FIGS. 4D to 4F are cross sectional views along the [011] direction at the respective manufacturing steps.
Figure 4E:
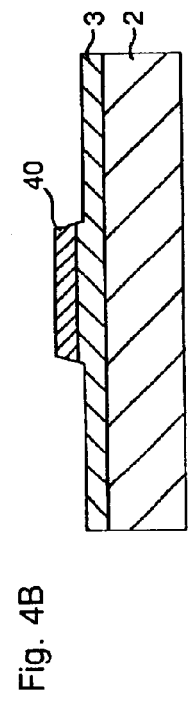
Figure 4F:
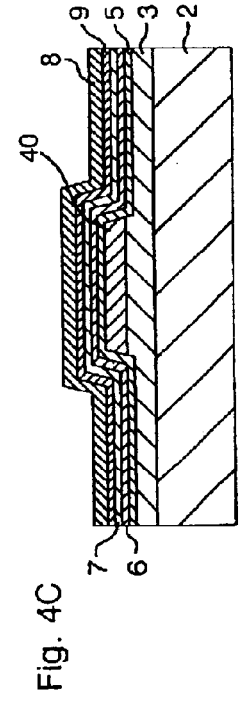

Drawings from 4A to 4C, from 5A to 5C and 6A to 6C show cross-sectional views taken along the [01-1] direction, while drawings from FIGS. 4D to 4F, from 5D to 5F and from 6D to 6F show views along the [011] direction. The manufacturing process is primarily divided into a sub-collector formation step, a primary mesa formation step and an electrode formation step.

An epitaxial growth in the sub-collector formation step and the primary mesa formation step uses the Metal Organic Chemical Vapor Deposition (MOCVD) technique. Various types of organic metals, such as TriEthyl Gallium (TEGa) and TriMethyl Indium (TMIn) are used as source materials for group III elements. On the other hand, Ars7ine (AsH$_3$) and Phosphine (PH$_3$) are source materials for the group V elements. To control the conduction type and the carrier concentration of grown layers, Silane (SiH$_4$) is for the n-type dopant and DiEthyl Zinc (DEZn) or Carbon Bromide (CBr$_4$,) is used for the p-type dopant. By mixing and supplying these source materials to the reaction chamber of the MOCVD equipment, and by adjusting the supply amount, layers with the predetermined composition and the desired carrier concentration can be obtained.

(First Epitaxial Growth)

As shown in FIG. 4A and FIG. 4B, a buffer film 3 and a sub-collector film 4 are sequentially grown on the (100) surface of the semi-insulating InP substrate 2. The buffer film is an undoped InGaAs with a thickness from 300 nm to 500 nm. The sub-collector film 4 is an n-type InGaAs highly doped with Si, the thickness of which is from 300 nm to 500 nm and the carrier concentration about $1 \times 10^{19}$ cm$^{-3}$.

(Formation of the Sub-Collector Layer)

A photoresist with a predetermined pattern is formed on the sub-collector film 4. The pattern is an island and rectangle shape, one pair of sides of the rectangle extending along the [011] direction. Etching of the sub-collector film 4 and the buffer film 3 forms the sub-collector layer 40, as shown in FIG. 4B and FIG. 4E. Etchant for the sub-collector film 4 is a mixture of a sulfuric acid, hydrogen peroxide and water. Since this mixture etches the InGaAs uniformly, side surfaces of the sub-collector layer 40 show a normal trapezoidal. It is preferable to etch a portion of the buffer film 3 to isolate absolutely the device from peripheral devices on the substrate 2. After the etching, the sub-collector layer 40 and the buffer layer 30 are formed, as shown in FIG. 4B and FIG. 4E.

(Second Epitaxial Growth)

After the formation of the sub-collector layer 40, a series of films of the collector 5, the base 6, the emitter 7, the intermediate film 9 and the emitter contact film 8 are sequentially grown on the InP substrate 2. The intermediate film 9, which will be converted to the intermediate layer 90, is an n-type InGaAs with a thickness about 20 nm and a carrier concentration about $1 \times 10^{18}$ cm$^{-3}$. The emitter contact film 8 is an n-type InGaAs with a thickness about 190 nm and a carrier concentration about $2 \times 10^{19}$ cm$^{-3}$, as shown in FIG. 4C and FIG. 4F.

(Formation of First Mesa)

The emitter contact layer 80 and the intermediate layer 90 form the first mesa. Another photo resist with a rectangle plane shape is formed on the emitter contact film 8. A pair of sides of the rectangle extends along the [011] direction. An etching forms the first mesa by a mixture of phosphoric acid, hydrogen peroxide and water. This etchant shows the selective etching characteristic, that is, the etching substantially stops at the InP of the emitter film 7 because the etching rate for InP is considerably smaller than the rate for the InGaAs. Therefore, only film 8 and film 9 are etched and the first mesa is formed as shown in FIG. 5A and FIG. 5D.

(Formation of Second Mesa)

Next, another photo resist with a rectangle pattern is formed on the emitter film 7. The rectangle pattern fully covers the first mesa and one pair of sides of the rectangle extends along the [011] direction. Two-step etching is performed for subsequent layers. First, only the InP emitter film 7 is etched with a mixture of hydrochloric acid, hydrogen peroxide and water. This mixture shows a selective characteristic for InGaAs: in which the etching rate for InGaAs is considerably smaller than that for the InP. Next, subsequent layers of the base film 6, the collector film 5 and the buffer film 3 are removed by the mixture of sulfuric acid, hydrogen peroxide and water. Since the latter mixture also shows the selective characteristic for InGaAs, the etching is substantially stopped after the exposure of InP substrate. This two-step etching forms the second mesa comprising the emitter layer 70, the base layer 60, the collector layer 50 and the buffer layer 30 as shown in FIG. 5B and FIG. 5E.

The mesa 10 contains the first mesa composed of the emitter contact layer 80 and the intermediate layer 90, and the second mesa is formed by layers from the buffer layer 30 to the emitter layer 70. The surface of the InP substrate 2 around the mesa 10 is exposed. This electrically isolates respective devices formed on the InP substrate 2.

(Electrodes Formation)

A self-aligned process forms the base electrode and the emitter electrode simultaneously. First, an insulating film 31 such as SiN is deposited on the entire surface of the substrate by the chemical vapor deposition technique. Openings to the SiN film 31 are formed by the reactive ion etching (RIE) technique to expose the emitter contact layer 80 and the emitter layer 70 provided at both sides of the emitter contact layer 80 with a photo resist pattern as an etching mask. Subsequently, a series of metals, such as titanium (Ti), platinum (Pt) and gold (Au), are deposited in the openings. Since the sides of the emitter contact layer 80 parallel to the [011] direction form the reverse trapezoid, metals do not deposit on regions of the emitter layer 70 covered by projections of the emitter contact layer 80. This means that metals on the emitter contact layer 80 and those formed on the emitter layer 70 are aligned automatically and completely isolated from each other. One advantage of the self-aligned process is to simplify the manufacturing process as depicted above. Another advantage of the self-aligned process is to bring the base electrode 16 close to the emitter electrode 18 formed on the emitter contact layer 80, which shortens the path from the base electrode 16 to the intrinsic region, decreases the base resistance and increases the high frequency performance of the HBT.

Removing the photo resist forms the base electrode 16 and the emitter electrode 18 because metals formed on the photo resist are removed at the same time, as shown in FIG. 5C and FIG. 5F. Thermal treatment at 400° C. for one minute makes ohmic contacts of the base electrode 16 and the emitter electrode 18 to the emitter contact layer 80 and the base layer 60, respectively.

Figure 6A:
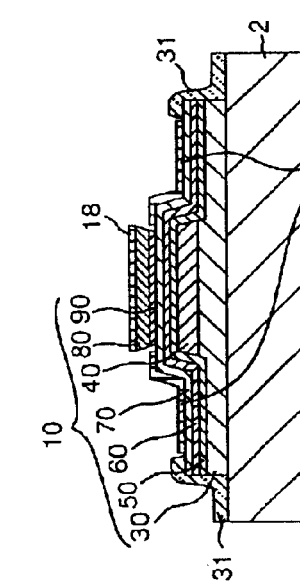
FIGS. 6A to 6C are cross sectional views along the [01-1] direction.

A process similar to the emitter and base electrode formation forms the collector electrode 15. An additional process, that is, to remove a series of layers (the emitter layer 70, the base layer 50 and the collector layer 40) to expose the surface of the sub-collector layer, is inserted before the deposition of metals after the etching of SiN film by the RIE technique. The resist assisted lift-off process described previously in FIG. 6A and FIG. 6D completes the collector electrode 15.

Figure 6B:
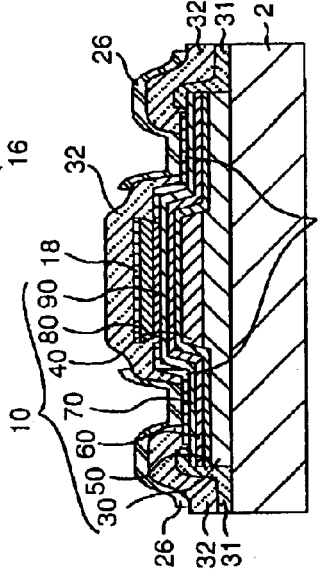
Figure 6C:
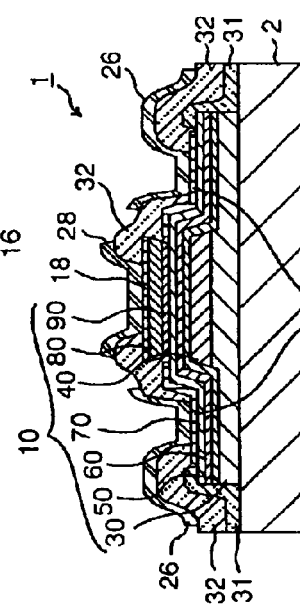
Figure 6D:
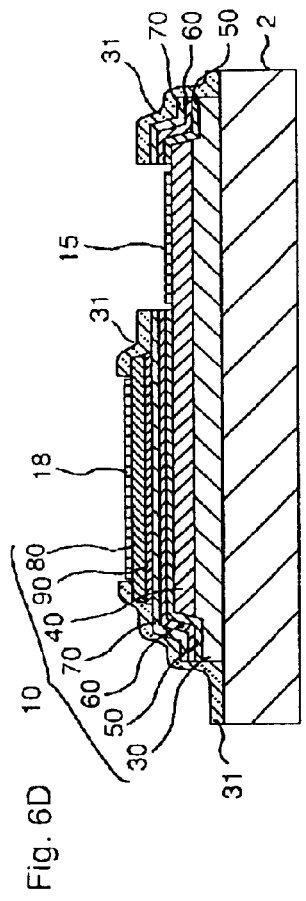
FIGS. 6D to 6F are cross sectional views along the [011] direction at the respective manufacturing steps.
Figure 6E:
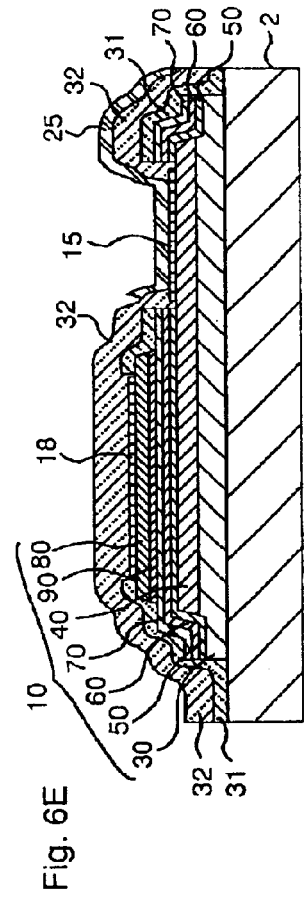
Figure 6F:
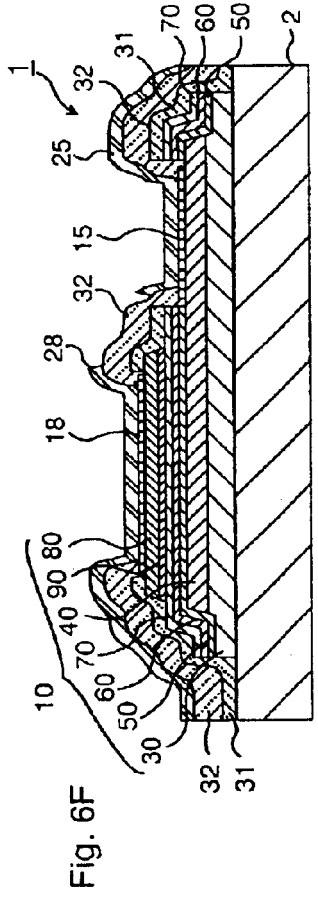

After the formation of the respective electrodes, another SiN film is formed on the entire surface of the substrate 2. First, the wiring to the collector electrode 15 and the base electrode 16 is formed by the sequential process of SiN etching and wiring metal depositing as shown in FIG. 6B and FIG. 6E. The process of etching the SiN film and depositing the wiring metals is the same as that previously described in the electrode formation. Next, the wiring to the emitter electrode is processed in the same manner as shown in FIG. 6C and FIG. 6F The wiring material is preferably aluminum (Al) or the combination of titanium (Ti), platinum (Pt) and gold (Au).

Second Embodiment

The second embodiment of the HBT according to the present invention is the same as the first embodiment except for the electron distribution in the emitter contact layer and the intermediate layer.

Figure 7A:
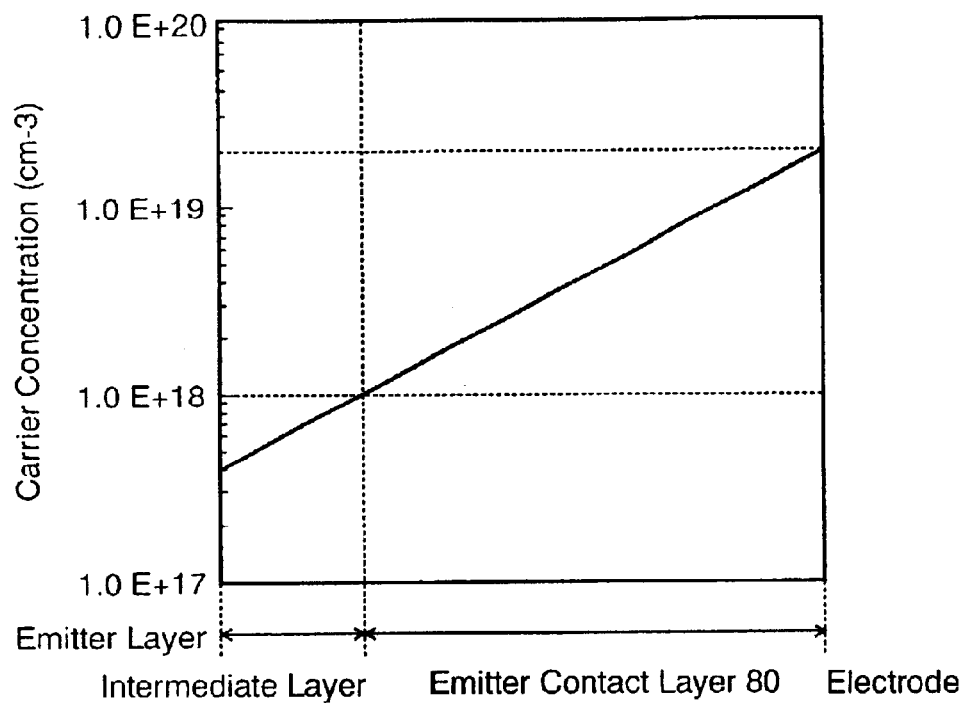
FIGS. 7A and 7B show an electron distribution in the intermediate and the emitter contact layer of the second embodiment of the invention.

FIG. 7A shows a typical electron distribution in the emitter contact layer 81 and the intermediate layer 91 in the second HBT 100. As shown in FIG. 7A, the electron concentration in the intermediate layer 91 is smaller than that in the emitter contact layer 81. The amount of electron concentration is $1\times10^{18}$ cm$^{-3}$ or smaller, and monotonically increases from the interface of the emitter layer 80 to the emitter contact layer 81. The minimum concentration is about $4\times10^{17}$ cm$^{-3}$ at the interface of the emitter layer 70. The distribution in the emitter contact layer 81 also monotonically increases from the interface of the intermediate layer 91 to the emitter electrode 18. The maximum concentration at the emitter electrode reaches $2\times10^{19}$ cm$^{-3}$.

Under the distribution thus described, the depletion region formed by the p-n junction between the base and the emitter expands into the emitter contact layer. The depth of the depletion region is greater than the case of the conventional HBT without the intermediate layer 81. The insertion of the intermediate layer 81 widens the distance between the conduction band of in the emitter contact layer and the valence band of the base layer. This reduces the leak current caused by the recombination of electrons in the emitter layer and holes in the base layer, thus enhancing the current gain 13 The electron distribution shown in FIG. 7 can be obtained by adjusting the amount of the dopant supplied during the growth of the intermediate film 91 and the emitter contact film 81.

The electron distribution is not limited to the linear behavior shown in FIG. 7A. A logarithmic behavior, an exponential behavior and their combination are also preferable in the present embodiment. Those distributions are also obtainable by adjusting the amount of the dopant to be supplied.

Next, the characteristics of the present HBT will be described. The device structures of the HBT 1 are shown in Table 1. The carbon is used as a p-type dopant for the base layer.

TABLE 1

Layer Structure of the present invention

| Layer | Material | Type | Thickness (nm) | Concent-ration (cm$^{-3}$) |
|---|---|---|---|---|
| Emitter Contact | InGaAs | n$^+$ | 190 | $2 \times 10^{19}$ |
| Intermediate | InGaAs | n$^-$ | 20 | $4 \times 10^{17}$ |
| Emitter | InP | n | 10 | $2 \times 10^{18}$ |
| Base | InGaAs | p$^+$ | 40 | $3 \times 10^{19}$ |
| Collector | InGaAs | n$^-$ | 500 | $5 \times 10^{16}$ |
| Sub-Collector | InGaAs | n$^+$ | 200 | $2 \times 10^{19}$ |

The device structures of the conventional HBT 50 are shown in Table 2. The dopant material is also carbon for the base layer in the conventional HBT.

TABLE 2

Layer Structure of the conventional HBT

| | Material | Type | Thickness (nm) | Concent-ration (cm$^{-3}$) |
|---|---|---|---|---|
| Emitter Contact | InGaAs | n$^+$ | 210 | $2 \times 10^{19}$ |
| Emitter | InP | n | 10 | $2 \times 10^{18}$ |
| Base | InGaAs | p$^+$ | 40 | $3 \times 10^{19}$ |
| Collector | InGaAs | n$^-$ | 500 | $5 \times 10^{16}$ |
| Sub-Collector | InGaAs | n$^+$ | 200 | $2 \times 10^{19}$ |

Figure 8A:
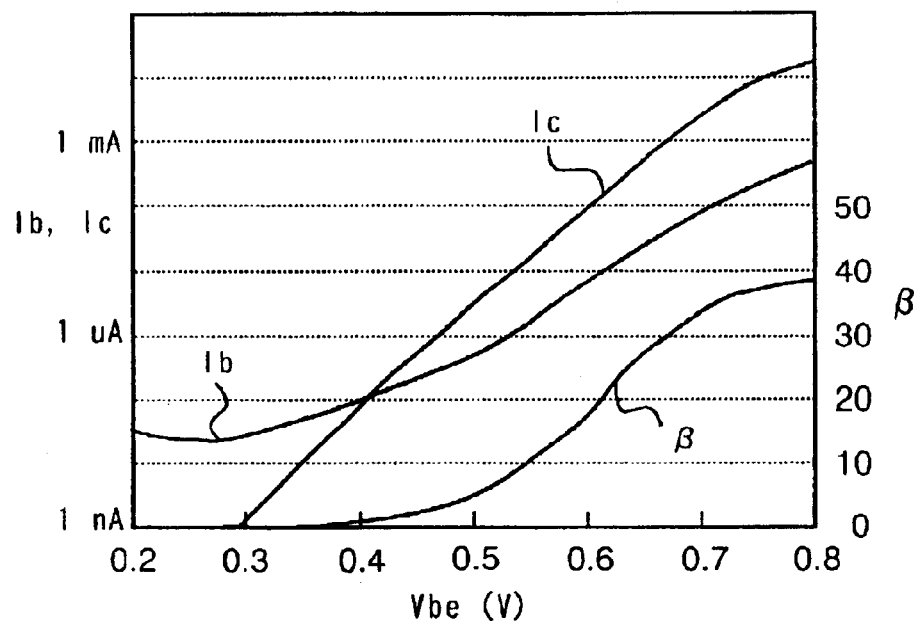
FIG. 8A shows behaviors of the base current, the collector current and the current gain of the bipolar transistor with the conventional HBT structure on the base-emitter bias voltage
Figure 8B:
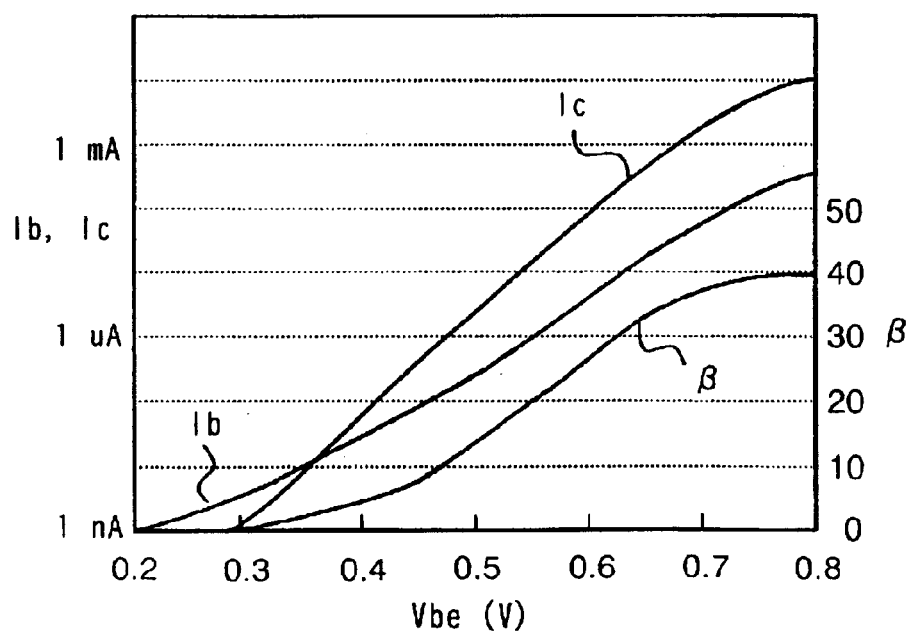
FIG. 8B shows characteristics of the HBT according to the present invention.

FIG. 8A shows the behaviors of the collector current Ic, the base current Ib and the current gain β calculated from the collector current and the base current for the conventional HBT of Table 2. FIG. 8B corresponds to the present HBT of Table 1. In FIG. 8A and FIG. 8B, the line Ib and the line Ic represents the base current and the collector current, respectively. The line β shows the current gain. The measurement was made under the condition of the emitter-grounded mode with the collector-base shortcut. The base and the collector current were measured with increasing the base-emitter forward bias, and the current gain β was calculated from the base current and the collector current by the relation β=Ic/Ib.

Comparing the present HBT to the conventional one, the behavior of the collector current Ic is nearly the same. However, the base current Ib of the respective HBT shows a particular difference. In the present HBT, the base current was smaller than 1 nA at the bias Vbe=0.2V and it was suppressed below 100 nA even at Vbe=0.48V. On the other hand in the conventional HBT, the base current exceeds 40 nA at Vbe=0.2V and it reached 100 nA at Vbe=0.4V.

Reflecting the base current, the current gain was clearly different at conditions lower than 0.5V.

Figure 7B:
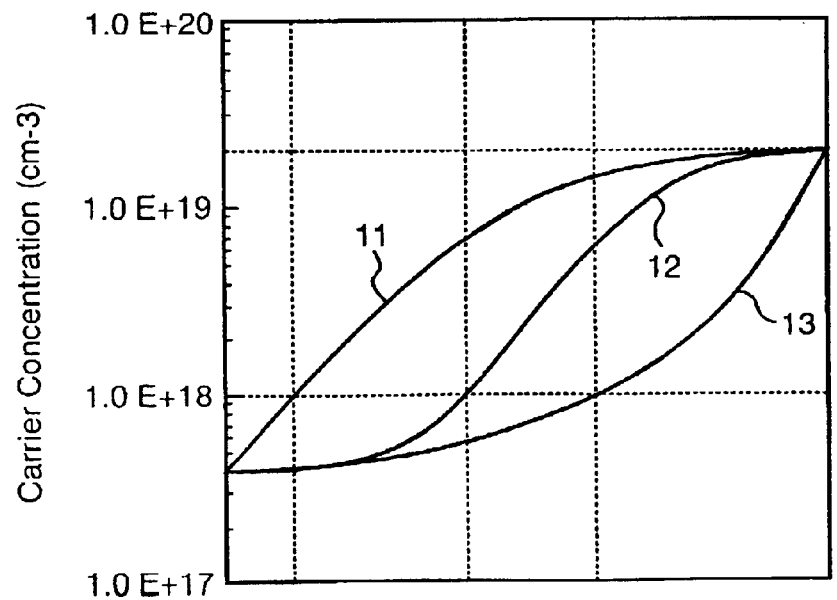

Such difference occurs due to the recombination current between holes in the valence band and electrons in the conduction band as described previously referring to FIG. 3. In the invented HBT of FIG. 7B, the existence of the intermediate layer reduces the recombination current because the layer is fully depleted, thus decreasing the base current at lower bias conditions as shown in FIG. 7B. Further, as understood from FIGS. 7A and 7B, the invention shows a particular advantage at low bias conditions.

From the invention thus described, the invention and its application may be varied in many ways. The thickness of the respective layers shown in Table 1 are illustrative and may be arranged. Such variations are not to be regarded as a departure from the spirit and scope of the invention, and all such modifications as would be obvious to one skilled in the art are intended for inclusion within the scope of the following claims.

Particularly for the intermediate layer 90 and the emitter contact layer, the thickness and materials may be optimized depending on the object and the application of the HBT. The intermediate layer and the emitter contact layer may be GaInAsP and GaInAs, respectively. Further, the composition of InGaAsP may be optional, for instance, it may be applicable to narrow the energy band gap of the layer gradually from the emitter layer to the emitter contact layer.

The emitter layer 70 may be InAlAs instead of InP. Since InAlAs lattice matched to InP has a greater band gap energy than InP, the HBT with InAlAs emitter shows superior performance similar to HBT of the present invention. Moreover, semiconductors with greater band gap energy than InGaAs, such as InP, GaInAsP and InAlAs, may apply to the collector layer 50. The minority carrier injection to the collector layer from the base may be reduced in such HBT with wide gap collector.

While the HBT of the present invention is formed on an InP substrate, another configuration is possible in which the collector and the base layer is GaAs while the emitter is made by AlGaAs or InGaP material.

What is claimed is:

1. A hetero-bipolar transistor having a collector layer, a base layer and an emitter layer on a semiconductor substrate, a band gap energy of the emitter layer being greater than a band gap energy of the base layer, a carrier depleted layer being formed by a junction between the base layer and the emitter layer, comprising:
    an intermediate layer provided on the emitter layer, the intermediate layer having a first carrier concentration and a band gap energy smaller than the band gap energy of the emitter layer; and
    an emitter contact layer provided on the intermediate layer, the emitter contact layer having a second carrier concentration greater than the first carrier concentration of the intermediate layer and a thickness, wherein
    the first carrier concentration of the intermediate layer is determined such that the carrier depleted layer formed by the junction between the base layer and the emitter layer extends beyond the intermediate layer, and
    the first carrier concentration of the intermediate layer decreases monotonically from an interface between the emitter contact layer and the intermediate layer, to the emitter layer.

2. The hetero-bipolar transistor according to claim 1, wherein the first carrier concentration of the intermediate layer is $1\times10^{18}$ cm$^{-3}$ or smaller.

3. The hetero-bipolar transistor according to claim 1, wherein a carrier concentration at the interface between the emitter contact layer and the emitter layer is $1\times10^{18}$ cm$^{-3}$ or smaller.

4. The hereto-bipolar transistor according to claim 1, wherein the thickness of the emitter layer is greater than 2 nm and smaller than 30 nm.

5. The hetero-bipolar transistor according to claim 1, wherein the emitter layer is made of InP, and the base layer and the intermediate layer are made of InGaAs lattice matched to InP.

6. The hetero-bipolar transistor according to claim 1, wherein the emitter layer is made of InAlAs, and the base layer and the intermediate layer are made of InGaAs lattice matched to InP.

7. The hetero-bipolar transistor according to claim 1, wherein the intermediate layer has a first interface with the emitter layer and a second interface with the emitter contact layer, and wherein the band gap energy of the intermediate layer monotonically decreases from the first interface to the second interface.

8. A hetero-bipolar transistor, comprising:
    a semiconductor substrate made of InP;
    a buffer layer provided on the InP substrate;
    a sub-collector layer provided on the buffer layer;
    a collector layer provided on the sub-collector layer;
    a base layer provided on the collector layer, the base layer having a first band gap energy;
    an emitter layer provided on the base layer, the emitter layer having a second band gap energy greater than the first band gap energy of the base layer, a carrier depleted layer being formed by a junction between the base layer and the emitter layer;
    an intermediate layer provided on the emitter layer, the intermediate layer having a first carrier concentration; and
    an emitter contact layer provided on the intermediate layer, the emitter contact layer having a second carrier concentration and a thickness, wherein
    the emitter layer is made of InP and the sub-collector layer, the collector layer, the base layer, the intermediate layer, and the emitter contact layer are made of InGaAs lattice matched to InP,
    said first carrier concentration is smaller than said second carrier concentration, and
    said first carrier concentration decreases monotonically from an interface between the emitter contact layer and the intermediate layer, to the emitter layer.

9. The hereto-bipolar transistor according to claim 8, wherein the first carrier concentration of the intermediate layer is determined so that the carrier depleted layer formed by the junction between the base layer and the emitter layer extends beyond the intermediate layer.

10. The hetero-bipolar transistor according to claim 8, wherein the first carrier concentration of the intermediate layer is $1\times10^{18}$ cm$^{-3}$ or smaller.

11. The hetero-bipolar transistor according to claim 8, wherein the thickness of the emitter layer is greater than 2 nm and smaller than 30 nm.

12. The hetero-bipolar transistor according to claim 8, wherein the intermediate layer has a first interface to the emitter layer and a second interface to the emitter contact layer, and wherein the band gap energy of the intermediate layer monotonically decreases from the first interface to the second interface.

13. The hetero-bipolar transistor according to claim 1, wherein the intermediate layer is made of InGaAs lattice matched to InP.

14. The hetero-bipolar transistor according to claim 1, wherein the emitter contact layer is made of InGaAs lattice matched to InP.

* * * * *